(12) United States Patent
Hansen et al.

(10) Patent No.: US 9,504,192 B2
(45) Date of Patent: Nov. 22, 2016

(54) ELECTRICAL MACHINE HAVING A SHIELDING PLATE

(71) Applicant: Robert Bosch GmbH, Stuttgart (DE)

(72) Inventors: Sebastian Hansen, Sasbach (DE); Christian Meyer, Karlsruhe-Wolfartsweier (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 14/675,989

(22) Filed: Apr. 1, 2015

(65) Prior Publication Data

US 2015/0289418 A1 Oct. 8, 2015

(30) Foreign Application Priority Data

Apr. 4, 2014 (DE) .................. 10 2014 206 536

(51) Int. Cl.
| | | |
|---|---|---|
| *H05K 7/20* | (2006.01) | |
| *H05K 9/00* | (2006.01) | |
| *H02K 11/00* | (2016.01) | |
| *H02K 5/08* | (2006.01) | |
| *H02K 5/20* | (2006.01) | |
| *H02K 15/12* | (2006.01) | |

(52) U.S. Cl.
CPC .............. *H05K 9/0007* (2013.01); *H02K 11/01* (2016.01); *H02K 11/33* (2016.01); *H05K 7/209* (2013.01); *H05K 7/2039* (2013.01); *H02K 5/08* (2013.01); *H02K 5/20* (2013.01); *H02K 15/12* (2013.01)

(58) Field of Classification Search
CPC .......... H05K 7/00; H05K 7/20; H05K 7/209; G06F 1/20; H01R 13/00; H01R 13/02; H02K 1/276; H02K 5/00; H02K 5/225; H02K 11/33; H02K 11/022; H02K 11/046; H02K 11/0073

USPC .............. 361/679.46, 679.54, 704–714, 816, 361/818; 165/80.2, 104.33; 310/58, 64, 310/68 R, 89, 90
See application file for complete search history.

(56) References Cited

U.S. PATENT DOCUMENTS

| | | | | |
|---|---|---|---|---|
| 4,668,898 | A * | 5/1987 | Harms ................. | H02K 11/33 310/227 |
| 7,095,146 | B2 * | 8/2006 | Fukazawa ............ | H02K 1/276 310/67 R |
| 7,256,522 | B2 * | 8/2007 | Johnson ................ | H02K 11/33 310/89 |
| 7,911,093 | B2 * | 3/2011 | Schueren ............. | H02K 5/225 310/68 R |
| 8,564,161 | B1 * | 10/2013 | Yamasaki ............ | B62D 5/0406 310/64 |
| 8,896,169 | B2 * | 11/2014 | Song ................... | H02K 11/0073 29/596 |
| 2010/0289351 | A1 * | 11/2010 | Maeda ................. | H02K 11/046 310/64 |
| 2015/0333595 | A1 * | 11/2015 | Berkouk ............... | H02K 11/022 310/71 |

FOREIGN PATENT DOCUMENTS

| | | | |
|---|---|---|---|
| CN | 202488327 U | * 10/2012 | .......... H02K 29/08 |
| DE | 60128530 | 10/2007 | |
| DE | 202009008803 | 9/2009 | |
| EP | 1696536 | 8/2006 | |
| WO | 2014012691 | 1/2014 | |

* cited by examiner

*Primary Examiner* — Michail V Datskovskiy
(74) *Attorney, Agent, or Firm* — Michael Best & Friedrich LLP

(57) ABSTRACT

Electrical machine (12) having a shielding plate (10), wherein the electrical machine (12) comprises a housing part (32) in which is arranged an electronic unit (14), and said electrical machine also comprises a metal heat sink (34) that is arranged on the housing part (32), wherein the electronic unit (14) is arranged between the shielding plate (10) and the heat sink (34).

19 Claims, 6 Drawing Sheets

ELECTRICAL MACHINE HAVING A SHIELDING PLATE

BACKGROUND OF THE INVENTION

The invention is based on an electrical machine having a shielding plate.

WO2014012691 discloses an electronic card that is arranged in a housing part of the electrical machine. At least one side of the electronic unit is only covered by means of a synthetic material covering. An electronic unit is used to control electrical machines. This electronic unit contains for example a control circuitry. The electronic unit is arranged in a housing part of the electrical machine. The process of operating an electrical machine generates electromagnetic alternating fields in the region of the electronic unit. These electromagnetic alternating fields influence the electronic unit and lead to faults in its function.

SUMMARY OF THE INVENTION

The electrical machine in accordance with the invention having a shielding plate having the features of the independent claim has the advantage with respect to the prior art that the electronic unit is shielded by means of a shielding plate and a metal heat sink that is arranged on the housing part. The electronic unit is arranged between the shielding plate and the heat sink. This advantageous embodiment of the electrical machine having a shielding plate has the advantage that the electronic unit is protected against undesired electromagnetic influences that disrupt its function. An electronic unit of this type is encompassed by means of an electrically conductive housing. Consequently, a Faraday cage is embodied around the electronic unit and said Faraday cage has a shielding effect.

The shielding plate comprises a frame. The frame is located on the outside on the shielding plate and extends around said shielding plate. A pole housing of the electrical machine is arranged within the frame. This ensures a large shielding surface area on the electrical machine since the shielding plate contacts the pole housing.

At least one receiving device for the pole housing is arranged within the frame. The receiving device renders it possible to connect the pole housing to the shielding plate in a simple manner. In addition, a continuous filled-in plate can be arranged within the frame. The filled-in plate offers maximum protection against electromagnetic influences. It is feasible to arrange a lattice within the frame. The lattice has the advantage of reducing the weight of the shielding plate. The mesh size of the lattice varies depending upon the wave length of the electromagnetic alternating field that is to be shielded. In addition to the lattice and the plate, a single cut-out is feasible so that neither the lattice nor the plate is arranged within the frame. This provides the largest possible mesh. The cut-out ensures a maximal weight reduction of the shielding plate.

The metal pole housing is electrically connected to the shielding plate. It is preferably embodied as one part with the pole housing. This has the advantage that the pole housing is a part of the shielding Faraday cage. Consequently, a large shielding effect is achieved.

The shielding plate is fastened to the electrical machine by means of clamps. The clamps engage in clamping sites of the heat sink. The clamps encompass the housing part and the heat sink. Clamp ends of the clamps lie against the heat sink at the clamping sites and on the frame of the shielding plate. The clamp ends of the clamps exert a force that presses the shielding plate and the heat sink against the housing part. This ensures a secure fastening arrangement of the shielding plate to the electrical machine. It further ensures an electrical contact with the heat sink in that the clamps contact the heat sink.

In an alternative embodiment, the shielding plate comprises frame clamps that are attached as one piece to the frame. The frame clamps encompass the housing part and engage in the heat sink so that said housing part is contacted by the shielding plate. The frame clamps likewise comprise clamp ends on which lie the clamping sites and the heat sink and the shielding plate press against the housing part.

In an alternative embodiment, resilient clamp elements are attached as one piece to the frame. The resilient clamp elements are used for fastening and electrically contacting the shielding plate to/with the electrical machine. The resilient clamp elements lie against the metal heat sink and/or the pole housing so as to provide an electrical contact. Said resilient clamp elements cut into the pole housing so as to mechanically fasten the resilient clamp elements, after which the pole housing would be arranged in the receiving device of the shielding plate, said receiving device being provided for the pole housing. The single part embodiment of frame clamps and/or resilient clamp elements has the advantage of a low ohmic resistance. The resilient clamp elements contact the pole housing and the heat sink within and/or outside of the housing part. This ensures a secure contacting arrangement having a low as possible ohmic resistance.

In an alternative embodiment, the clamps are attached to the heat sink in a materially connected manner. The clamps can be soldered, welded or adhered to the heat sink. This has the advantage of fastening the shielding plate to the heat sink in a cost-effective manner.

The shielding plate comprises through-going holes to receive screws. The shielding plate is screwed on and/or riveted on by means of the through-going holes. The through-going holes are arranged in the frame and/or in a receiving plate that encompasses the receiving device. The through-going holes ensure a cost-effective and secure fastening arrangement of the shielding plate to the electrical machine.

In an alternative embodiment, the shielding plate is arranged within the housing part. It is preferred that the housing part is injection molded around the shielding. This has the advantage of an efficient shielding arrangement against electromagnetic influences.

In one embodiment, it is possible to arrange the shielding plate on the outside on the base of the housing part that lies opposite the heat sink. This has the advantage that the shielding plate can be assembled in a simple manner.

In an alternative embodiment, metal spacers are used to electrically connect the shielding plate to the heat sink. The metal spacers are arranged between the heat sink and the shielding plate. The spacers directly contact the shielding plate and the heat sink. This has the advantage of a secure electrical contacting arrangement.

It is possible to reduce the installation space in a cost-effective manner if the housing part is embodied from synthetic material and the electronic unit is embodied from a printed circuit board that extends in particular over an entire base plate of the housing part and the shielding plate extends approximately parallel to the circuit board.

If the heat sink closes the housing part as a housing lid, it is thus possible using few components to provide a sealed and shielded housing for the electronic unit.

BRIEF DESCRIPTION OF THE DRAWINGS

Exemplary embodiments of the invention are illustrated and further explained in the description hereinunder.

In the drawings.

DETAILED DESCRIPTION

Figure 1:
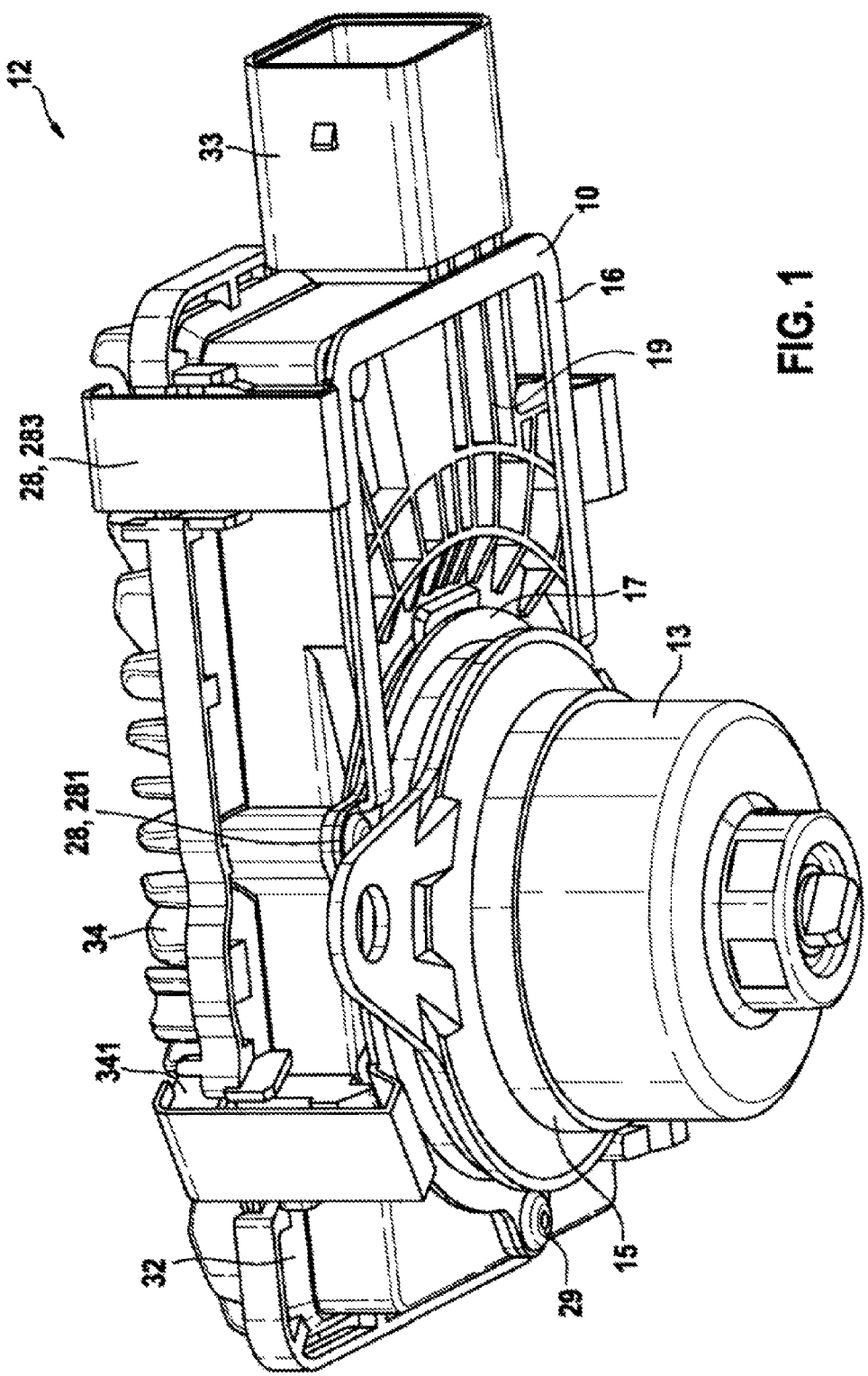
FIG. 1 illustrates an electrical machine in accordance with the invention having a shielding plate that is fastened by means of one-piece frame clamps.

FIG. 1 illustrates an electrical machine 12 having a shielding plate 10. The electrical machine 12 comprises a housing part 32 that is embodied as an electronic housing. An electronic unit 14 (not illustrated) is arranged in the housing part 32 and said electronic unit is embodied by way of example as a circuit board. The housing part 32 is preferably produced from synthetic material. A heat sink 34 is arranged on the housing part 32. The heat sink 34 is attached to the housing part 32 from the outside so that the heat sink 34 is uncovered. The heat sink 34 extends essentially along one side of the housing part 32. A shielding plate 10 and a pole housing 13 are arranged on the side of the housing 32 that lies opposite the heat sink 34. The shielding plate 10 comprises a frame 16. The frame 16 forms the outer contour of the shielding plate 10. The frame 16 extends approximately along an outer edge of a side of the housing part 32. Frame clamps 28, 283 are attached to the frame 16. The frame clamps 28, 283 are connected as one piece to the frame 16. The frame clamps 28, 283 encompass the housing part 32 and the heat sink 34. The frame clamps 28, 283 engage in clamping sites 341 that are provided for this purpose, wherein the clamping sites 341 are arranged on the heat sink 34. The clamping sites 341 are integrated as one piece in the heat sink 34. The clamping sites 341 are preferably embodied from cooling ribs of the heat sink 34. The shielding plate 10 preferably lies directly against the housing 32. The frame clamps 28, 283 comprise clamp ends 208 that lie against the clamping sites 341 and press the heat sink 34 and the shielding plate 10 against the housing part 32 by means of a resilient force. In addition to the fastening arrangement by means of frame clamps 28, 283, the shielding plate 10 comprises through-going holes 28, 281 for receiving connecting elements. Furthermore, the shielding plate 10 comprises a receiving plate 17 within the frame 16 and said receiving plate is connected as one piece to the frame 16. The receiving plate 17 is embodied in a circular manner and is used to receive the pole housing 13. The pole housing 13 is arranged in the receiving device. The pole housing 13 is arranged on the base side of the housing part 32 that lies opposite the heat sink 34. The pole housing 13 extends beyond the base side in the radial direction. The pole housing 13 extends upwards in the axial direction from the housing part 32. The shielding plate 10 entirely encompasses the pole housing 13 in the circumferential direction. The shielding plate 10 contacts the pole housing 13. The pole housing 13 comprises fastening links that extend transverse with respect to the axial direction of the housing 13. The fastening links comprise holes that in the assembled state are aligned with the through-going holes 281 of the shielding plate 10 so that screws 29 can be inserted into the through-going holes 281. In this manner, the pole housing 13 and the shielding plate 10 are fastened to the housing part 32. The electrical contact between the pole housing 13 and the shielding plate 10 is likewise achieved by means of this direct overlapping of the fastening links and the through-going holes 281. In addition, a fastening flange 15 is arranged on the pole housing 13. The fastening flange 15 encompasses the pole housing 13 in the circumferential direction. The fastening flange 15 is used so as to fasten the electrical machine 12 to an apparatus that is to move or to the body of the vehicle. The housing part 32 comprises a plug socket 33 on one side. This plug socket 33 is used to electrically connect the electrical machine 12. The frame 16 comprises four frame clamps 283. The heat sink 34 comprises four clamping sites 341. The shielding plate 10 is fastened to the housing part 32 by way of example by means of three screws 29. The outer circumference of the shielding plate 10 is essentially rectangular and the receiving plate 17 for the pole housing 13 is embodied in an approximately circular manner.

Figure 2:
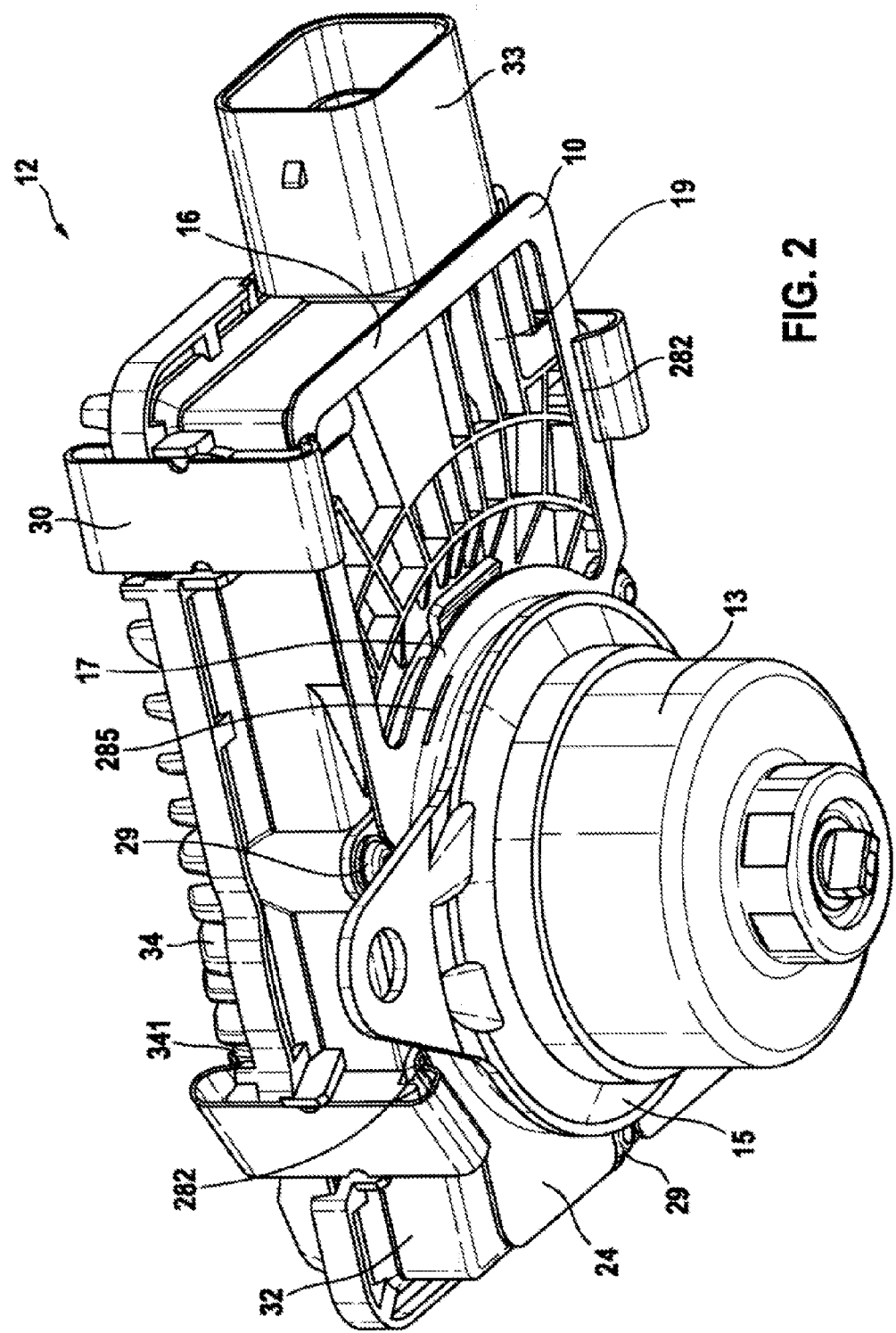
FIG. 2 illustrates an electrical machine in accordance with the invention having a shielding plate that is fastened by means of separate clamps.

FIG. 2 illustrates an electrical machine 12 that is constructively identical to that in FIG. 1, however, the shielding plate 10 is illustrated in an alternative embodiment. In this case, the shielding plate 10 does not comprise any frame clamps 283 that are embodied as one piece. Clamps 30 are illustrated and said clamps are used so as to fasten and to electrically contact the shielding plate 10, wherein the clamps 30 are embodied as separate components. An electrical contacting arrangement of the shielding plate 10 to the heat sink 34 is produced. The clamps 30 encompass the housing part 32 around the heat sink 34. The clamps 30 engage in clamping sites 341 of the heat sink 34. The shielding plate 10 comprises plate clamping sites 282 in its frame 16. The frame 16 comprises four plate clamping sites 282. These plate clamp sites 282 receive clamp ends 208 of the clamps 30. The clamps 30 consequently encompass the shielding plate 10, the housing part 32 and the heat sink 34 and press said parts against one another by means of a resilient force. The receiving plate 17 comprises resilient clamping elements 285 that are aligned radially inwards. The resilient clamping elements 285 contact the pole housing 13 on its outer side in that the resilient clamping elements 285 cut into the pole housing 13. In addition to the electrical contacting arrangement, the resilient clamping elements 285 ensure a mechanical fastening arrangement by means of cutting into said pole housing. One embodiment of the resilient clamping elements 285 is possible that comprises a tip that is directed in a direction that is radial to the pole housing 13 on the resilient clamping elements. This radial directed tip cuts into the outer face of the pole housing 13. This ensures a low resistance electrical contacting arrangement. The frame 16 is cut-out here in the region of the screws 29 so that in the assembled state, the screws 29 of the fastening flange can be loosened and tightened. The shielding plate 10 is fastened by means of three screws 29 to the housing part 32. Furthermore, only one single recess 19 is arranged within the frame 10 on the side of the plug socket 33 in relation to the pole housing 13. The recess 19 extends from the frame 16 to the receiving plate 17. The frame 16 is embodied as peripheral plate strips that form the outer periphery of the shielding plate 10. By way of example, a continuous filled-in plate 24 is embodied between the receiving device 17 and the frame 16 on the end of the shielding plate 10 that lies opposite the plug socket 33.

Figure 3A:
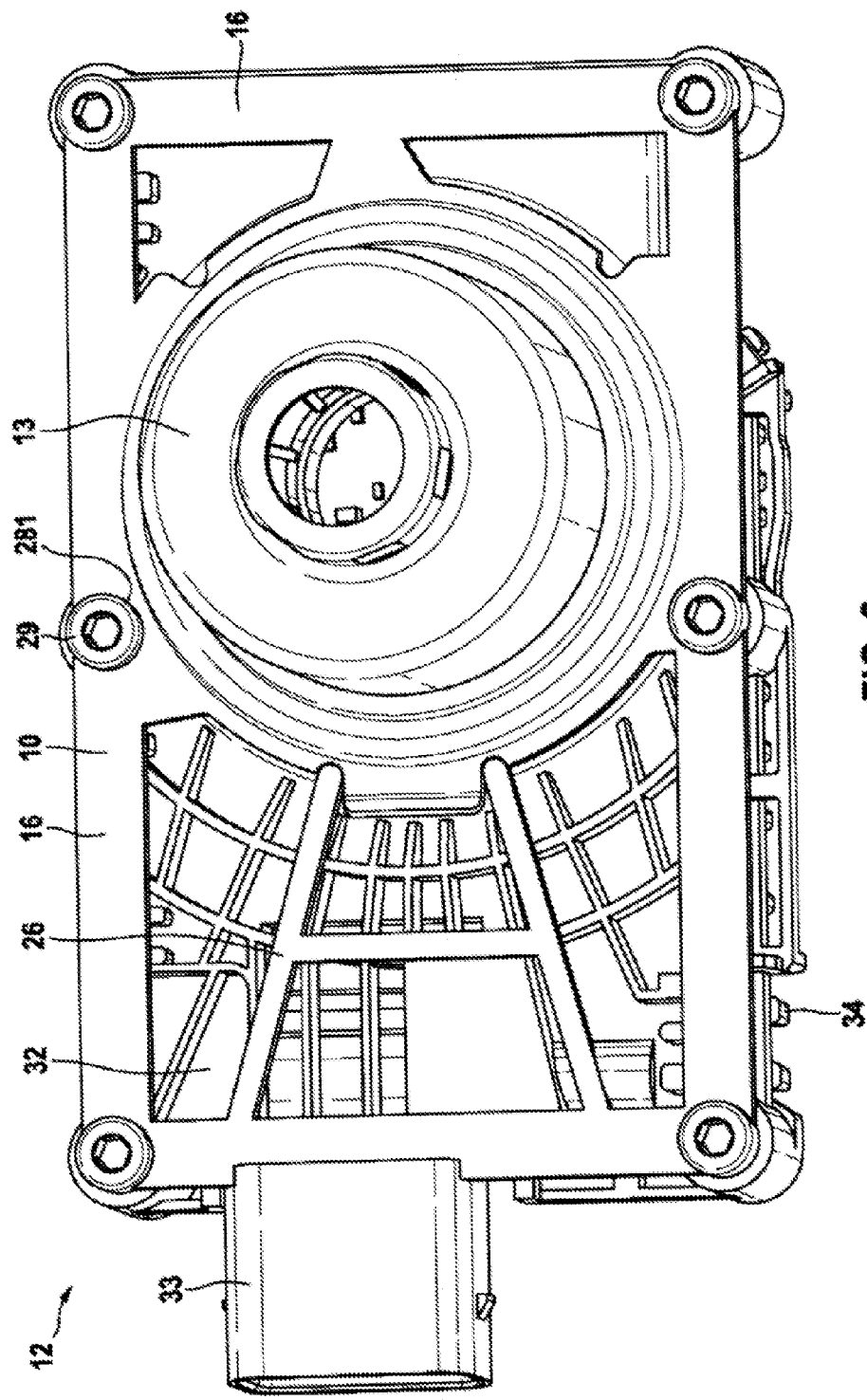
FIG. 3a illustrates an electrical machine in accordance with the invention having a shielding plate that is embodied as one piece with the pole housing and is fastened by means of screws.
Figure 3B:
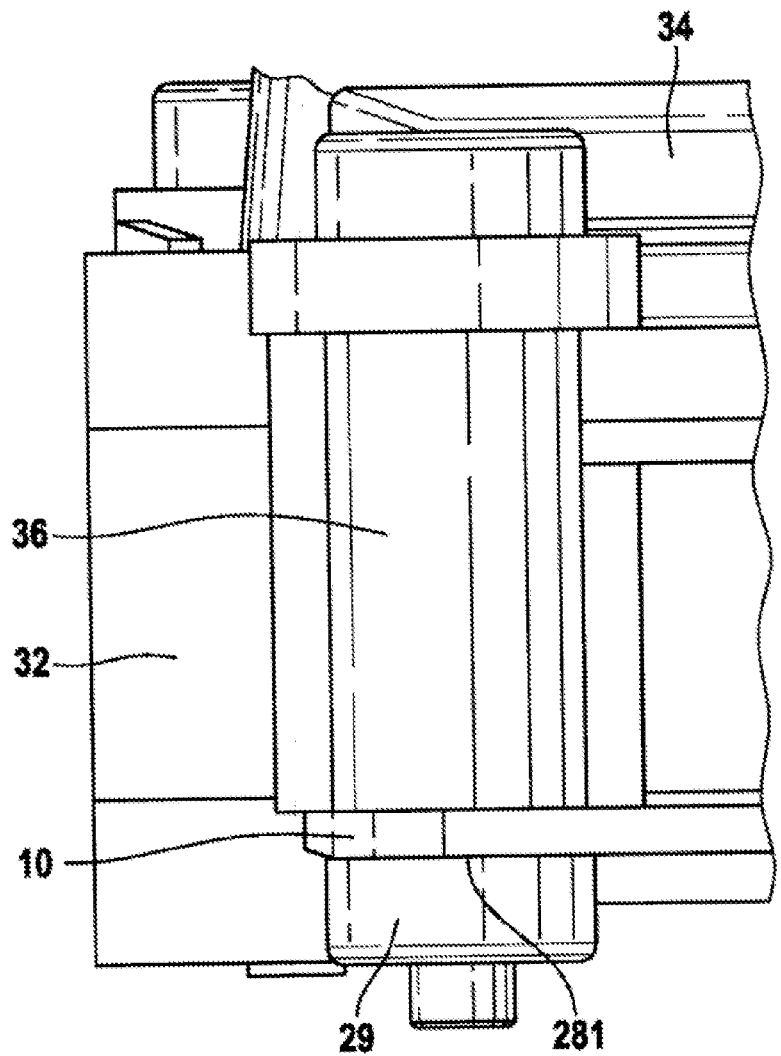
FIG. 3b illustrates a metal spacer sleeve for contacting the heat sink by means of the shielding plate.

FIG. 3a illustrates an embodiment in which a shielding plate 10 is only fastened to the housing part 32 by means of screws 29. Clamps 30, 283 are not used. The pole housing 13 is connected as one piece with the shielding plate 10. A lattice 26 that is connected as one piece to the frame 16 is arranged within the frame 16. The frame 16 is screwed onto the housing part 32 by way of example by means of six screws 29. Alternatively, rivets are also possible as connecting elements. FIG. 3b illustrates the electrical contacting arrangement of the heat sink 34 to the shielding plate 10 and said contacting arrangement is achieved in the case of this embodiment by means of spacers 36. The spacers 36 are embodied from metal. The spacers 36 align with the through-going holes 281 of the shielding plate 10 and receiving holes of the heat sink 34. The spacer 36 is in direct physical contact with the heat sink 34 and the shielding plate 10. A low resistance contact arrangement is produced in this manner. The shielding plate 10, the spacer 36 and the heat sink 34 are connected to one another by means of the screws 29.

Figure 4A:
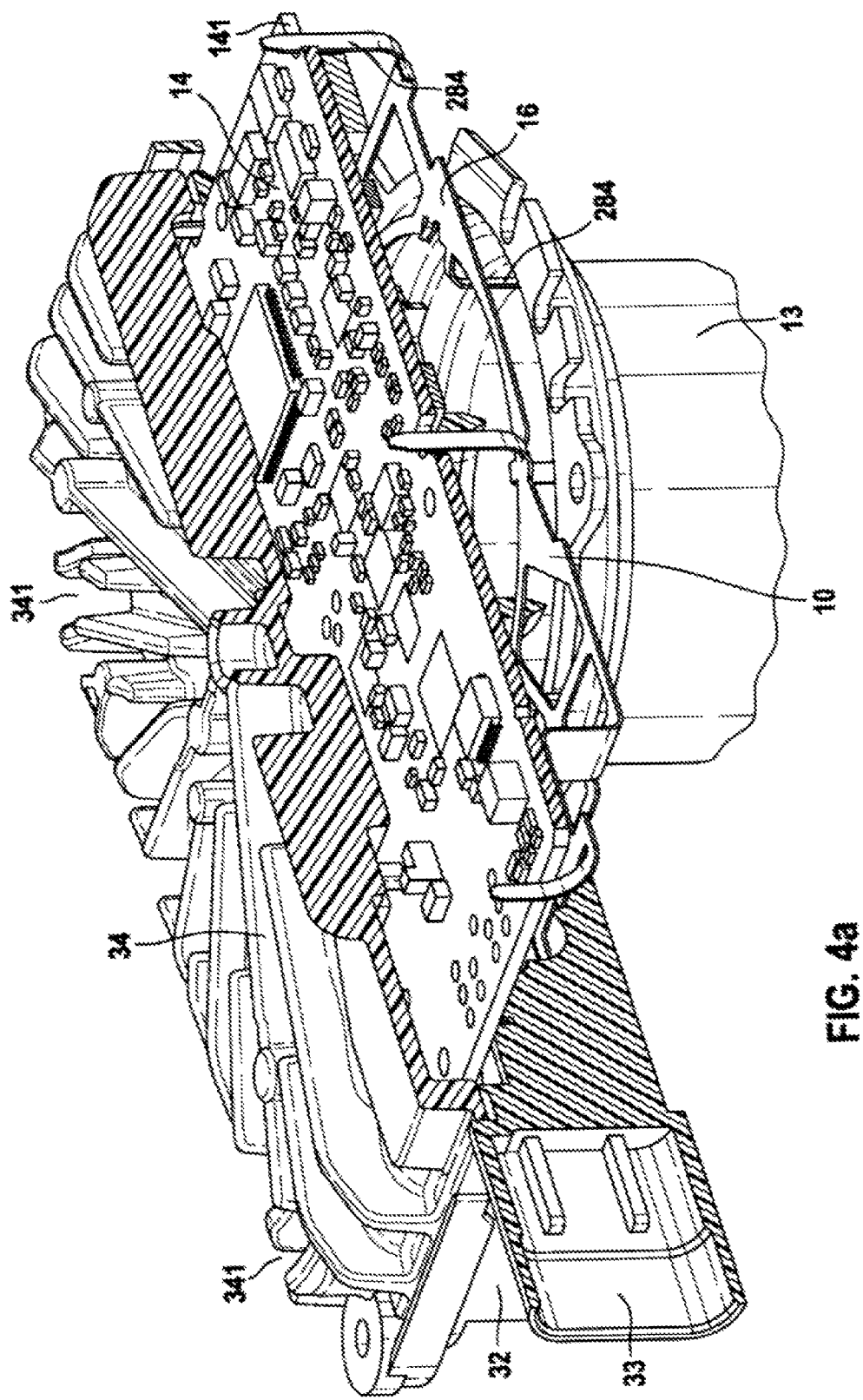
FIG. 4a illustrates a sectional view of an electrical machine in accordance with the invention having a shielding plate that lies on the inside, wherein resilient clamping elements contact the pole housing and the heat sink.
Figure 4B:
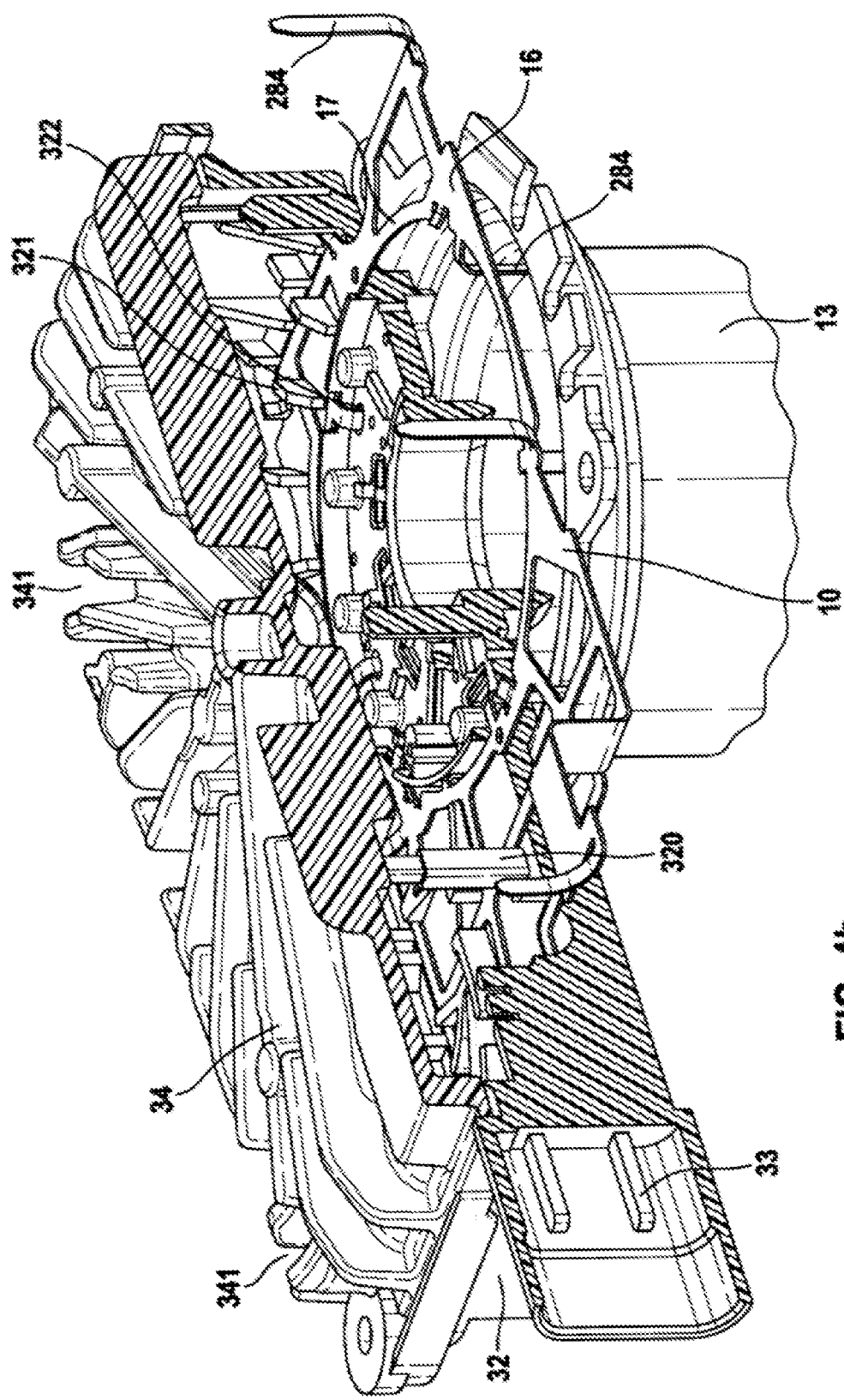
FIG. 4b illustrates a sectional view of an electrical machine having a shielding plate that lies on the inside, wherein the shielding plate is aligned by means of positioning extensions.

FIG. 4a illustrates a sectional view through a further electrical machine 12 as claimed in the invention. An electronic unit 14 is arranged below the heat sink 34. A shielding plate 10 is arranged below the electronic unit 14 and within the housing 32. A pole housing 13 is arranged on the side of the housing 32 that lies opposite the heat sink 34. The shielding plate 10 contacts the heat sink 34 and the pole housing 13 by means of resilient clamping elements 284. The resilient clamping elements 284 are fastened as one piece to the frame 16. The electronic unit 14 comprises feedthroughs 141 for the resilient clamping elements 284. The resilient clamping elements 284 of the shielding plate 10 that lies below the electronic unit 14 can thus be fed through the feedthroughs 141 in order to contact the heat sink 134. The housing part 32 comprises feedthroughs 322 on the side of the housing part 32 on which the pole housing 13 is arranged. This is illustrated in FIG. 4b). The feedthroughs 141 are used by the resilient clamping elements 284 so as to contact the pole housing 13. The resilient clamping elements 284 of the shielding plate 10 that lies within the housing part 32 are fed through the feedthroughs 141 in order to electrically contact the pole housing 13 on its inner face. The housing part 32 comprises axial extensions 320, 321 on its inner face. The extensions 320, 321 are used on the one hand so as to align the shielding plate 10 and on the other hand so as to position the heat sink 34. Furthermore, the extensions 320 are used so as to position the electronic unit 14.

The housing part 32 is embodied from synthetic material and the electronic unit 14 is embodied as a printed circuit board that extends in particular over an entire base plate of the housing part 32 and the shielding plate 10 extends approximately parallel to the printed circuit board. The heat sink 34 closes the housing part 32 as a housing lid.

One embodiment is also feasible in which the shielding plate 10 is embodied as an electrically conductive foil within the housing part 32 or is arranged on the outside on the housing part 32. One embodiment is also possible in which the housing part 32 is injection molded around the foil. The foil shields the electronic unit 14 against electromagnetic radiation. The housing part 32 can also be injection molded around the foil. The electronic unit 14 is arranged between the foil and the heat sink 34. The foil contacts the heat sink 34 in an electrical manner.

It is to be noted that, with regard to the exemplary embodiments that are illustrated in the figures and the description, multiple combination possibilities of the individual features are possible. The electrical machine 12 is used as an adjustment drive in automobiles. Said machine is used for example as a drive for window actuators, sliding roofs, trunk lids, engine compartment actuators and/or a transmission actuator. In addition to these applications, an application in other technical fields is also possible.

What is claimed is:

1. An electrical machine (12), wherein the electrical machine (12) comprises a housing part (32) in which is arranged an electronic unit (14) and said electrical machine also comprises a metal heat sink (34) that is arranged on the housing part (32), characterized in that the electronic unit (14) is arranged between a shielding plate (10) and the heat sink (34), wherein a pole housing (13) is electrically connected to the shielding plate (10).

2. The electrical machine (12) as claimed in claim 1, characterized in that the shielding plate (10) comprises a frame (16), wherein the frame (16) extends around an outside of the shielding plate, and a pole housing (13) of the electrical machine (12) is arranged within the frame (16).

3. The electrical machine (12) as claimed in claim 1, characterized in that one or more of the following is arranged within the frame: a receiving device (17) for the pole housing (13); a continuous filled-in plate (24); a lattice (26) and a single cut-out (19).

4. The electrical machine (12) as claimed in claim 1, characterized in that the shielding plate (10) is fastened to the electrical machine (12) by means of clamps (283, 30), wherein the clamps (283, 30) engage in clamping sites (341) of the heat sink (34), and the clamps (283, 30) encompass the housing part (32) and the heat sink (34).

5. The electrical machine (12) as claimed in claim 1, characterized in that the clamps (283, 30) are frame clamps (283) that are attached as one piece to the frame (16).

6. The electrical machine (12) as claimed in claim 1, characterized in that the shielding plate (10) comprises resilient clamping elements (284, 285) that are attached as one piece to the frame (16), and that the resilient clamping elements (284, 285) electrically contact the pole housing (13) and/or the heat sink (34) within and/or outside the housing part (32).

7. The electrical machine (12) as claimed in claim 1, characterized in that the clamps (283, 30) are attached to the heat sink (34) in a materially connected manner.

8. The electrical machine (12) as claimed in claim 1, characterized in that the shielding plate (10) comprises through-going holes (281) configured to receive connecting elements with which the shielding plate (10) is screwed on to and/or riveted on to the housing part (32) and/or the heat sink (34).

9. The electrical machine (12) as claimed in claim 1, characterized in that the shielding plate (10) is arranged on an outside on a base plate of the housing part (32) that lies opposite the heat sink (34).

10. The electrical machine (12) as claimed in claim 1, characterized in that the shielding plate (10) is arranged within the housing part (32).

11. The electrical machine (12) as claimed in claim 1, characterized in that there is an electrically conductive connection between the heat sink (34) and the shielding plate (10).

12. The electrical machine (12) as claimed in claim 11, characterized in that the electrically conductive connection is produced by means of metal spacers (36) that are arranged between the heat sink (34) and the shielding plate (10) so that said heat sink and shielding plate directly contact one another in an electrical manner.

13. The electrical machine (12) as claimed in claim 1, characterized in that the housing part (32) is embodied from synthetic material and the electronic unit (14) is embodied as a printed circuit board and the shielding plate (10) extends approximately parallel to the circuit board.

14. The electrical machine (12) as claimed in claim 1, characterized in that the heat sink (34) is embodied as a housing lid that closes the housing part (32).

15. The electrical machine (12) as claimed in claim 1, characterized in that a pole housing (13) is electrically connected as one piece to the shielding plate (10).

16. The electrical machine (12) as claimed in claim 1, characterized in that the shielding plate (10) is arranged within the housing part (32) and the housing part (32) is injection molded around said plate.

17. The electrical machine (12) as claimed in claim 1, characterized in that the housing part (32) is embodied from synthetic material and the electronic unit (14) is embodied as a printed circuit board that extends over an entire base plate of the housing part (32) and the shielding plate (10) extends approximately parallel to the circuit board.

18. An electrical machine (12), wherein the electrical machine (12) comprises a housing part (32) in which is arranged an electronic unit (14) and said electrical machine also comprises a metal heat sink (34) that is arranged on the housing part (32), wherein the electronic unit (14) is arranged between a shielding plate (10) and the heat sink (34), and wherein the shielding plate (10) is arranged within the housing part (32).

19. An electrical machine (12), wherein the electrical machine (12) comprises a housing part (32) in which is arranged an electronic unit (14) and said electrical machine also comprises a metal heat sink (34) that is arranged on the housing part (32), wherein the electronic unit (14) is arranged between a shielding plate (10) and the heat sink (34), and wherein the housing part (32) is embodied from synthetic material and the electronic unit (14) is embodied as a printed circuit board and the shielding plate (10) extends approximately parallel to the circuit board.

\* \* \* \* \*